(12) United States Patent
Vora

(10) Patent No.: US 7,710,148 B2
(45) Date of Patent: May 4, 2010

(54) PROGRAMMABLE SWITCH CIRCUIT AND METHOD, METHOD OF MANUFACTURE, AND DEVICES AND SYSTEMS INCLUDING THE SAME

(75) Inventor: Madhukar B. Vora, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/156,565

(22) Filed: Jun. 2, 2008

(65) Prior Publication Data

US 2009/0295427 A1    Dec. 3, 2009

(51) Int. Cl.
*H01L 25/00* (2006.01)
*H03K 19/177* (2006.01)

(52) U.S. Cl. .............................. 326/41; 326/47; 326/113

(58) Field of Classification Search .................... 326/41, 326/47, 113
See application file for complete search history.

(56) References Cited

U.S. PATENT DOCUMENTS

| | | |
|---|---|---|
| 3,412,286 A | 11/1968 | Grebene |
| 3,930,300 A | 1/1976 | Nicolay |
| 3,936,929 A | 2/1976 | Bean et al. |
| 3,943,551 A | 3/1976 | Skorup |
| 3,951,702 A | 4/1976 | Kano et al. |
| 3,955,182 A | 5/1976 | Bert |
| 3,967,305 A | 6/1976 | Zuleeg |
| RE28,905 E | 7/1976 | Hodges |
| 3,982,264 A | 9/1976 | Ishitani |
| 4,036,672 A | 7/1977 | Kobayashi |
| 4,038,563 A | 7/1977 | Zuleeg et al. |
| 4,040,082 A | 8/1977 | Goser |
| 4,062,036 A | 12/1977 | Yoshida |
| 4,228,367 A | 10/1980 | Brown |
| 4,333,224 A | 6/1982 | Buchanan |
| 4,485,392 A | 11/1984 | Singer |
| 4,486,670 A | 12/1984 | Chan et al. |
| 4,613,772 A | 9/1986 | Young |
| 4,631,426 A | 12/1986 | Nelson et al. |
| 4,638,344 A | 1/1987 | Cardwell, Jr. |
| 4,663,543 A | 5/1987 | Sitch |
| 4,667,312 A | 5/1987 | Doung et al. |

(Continued)

FOREIGN PATENT DOCUMENTS

EP    0 276 670 A1    8/1988

(Continued)

OTHER PUBLICATIONS

U.S. Appl. No. 11/888,977, Thummalapally et al.

(Continued)

*Primary Examiner*—Anh Q Tran
(74) *Attorney, Agent, or Firm*—Haverstock & Owens, LLP

(57) ABSTRACT

A switching circuit can include a logic circuit having a logic circuit input and a logic circuit output and at least three input transistors coupled to provide three separate paths between three input/output (I/O) nodes and the logic circuit input. The switching circuit can further include at least three output transistors coupled to provide three separate paths between the three I/O nodes and the logic circuit output. Methods of fabricating such switch circuits and devices and/or systems including such switching circuits are also disclosed.

20 Claims, 6 Drawing Sheets

U.S. PATENT DOCUMENTS

| | | |
|---|---|---|
| 4,670,749 A | 6/1987 | Freeman |
| 4,698,653 A | 10/1987 | Cardwell, Jr. |
| 4,703,199 A | 10/1987 | Ely |
| 4,743,862 A | 5/1988 | Scheinberg |
| 4,751,556 A | 6/1988 | Cogan et al. |
| 4,763,028 A | 8/1988 | Henry |
| 4,767,946 A | 8/1988 | Taylor |
| 4,777,517 A | 10/1988 | Onodera et al. |
| 4,853,561 A | 8/1989 | Gravrok |
| 5,003,200 A | 3/1991 | Sakamoto |
| 5,130,770 A | 7/1992 | Blanc et al. |
| RE34,363 E | 8/1993 | Freeman |
| 5,408,198 A | 4/1995 | Kusunoki |
| 5,618,688 A | 4/1997 | Reuss |
| 5,773,891 A | 6/1998 | Delgado |
| 5,808,501 A | 9/1998 | Ivanov |
| 5,808,502 A | 9/1998 | Hui et al. |
| 5,973,341 A | 10/1999 | Letavic et al. |
| 6,031,392 A | 2/2000 | Yee |
| 6,105,106 A | 8/2000 | Manning |
| 6,125,379 A | 9/2000 | Lin |
| 6,307,223 B1 | 10/2001 | Yu |
| 7,196,550 B1 * | 3/2007 | Reinschmidt ............... 326/113 |
| 7,463,055 B2 * | 12/2008 | Ciccarelli et al. ............. 326/38 |
| 2002/0197779 A1 | 12/2002 | Evans |
| 2003/0012186 A1 | 1/2003 | Rowe et al. |
| 2004/0061578 A1 | 4/2004 | Vice |
| 2005/0077918 A1 * | 4/2005 | Teifel et al. .................... 326/41 |
| 2007/0096144 A1 | 5/2007 | Kapoor |
| 2007/0126478 A1 | 6/2007 | Kapoor |
| 2007/0284628 A1 | 12/2007 | Kapoor |

FOREIGN PATENT DOCUMENTS

| | | | |
|---|---|---|---|
| GB | 2208967 | * | 4/1989 |
| GB | 2208967 A | | 4/1989 |
| JP | 60-258948 | | 12/1985 |
| JP | 60258948 A | | 12/1985 |

OTHER PUBLICATIONS

U.S. Appl. No. 11/796,434, Vora, Madhukar.

Hamadé, Adib R., "A JFET/Bipolar Eight-Channel Analog Multiplexer", *IEEE Journal of Solid-State Circuits*, Dec. 1975, pp. 399-406, vol. SC-10, No. 6.

Takagi et al., "Complementary JFET Negative-Resistance Devices", *IEEE Journal of Solid-State Circuits*, Dec. 1975, pp. 509-515, vol. SC-10, No. 6.

Ozawa, Osuma, "Electrical Properties of a Triode-Like Silicon Vertical-Channel JFET", *IEEE Transactions on Electron Devices*, Nov. 1980, pp. 2115-2123, vol. ED-27, No. 11.

Lehovec, Kurt, "Analysis of GaAs FET's for Integrated Logic", *IEEE Transactions on Electron Devices*, Jun. 1980, pp. 1074-1091, vol. ED-27, No. 6.

Nanver et al., "Design Considerations for Integrated High-Frequency p-Channel JFET's", *IEEE Transactions on Electron Devices*, Nov. 1988, pp. 1924-1934, vol. 35, No. 11.

Moulic, J., "Field-Effect Transistor Shifted Logic", *IBM Technical Disclosure Bulletin*, vol. 33, No. 3A, Aug. 1990.

PCT Written Opinion of the International Search Authority for International Application No. PCT/US2009/044422, dated Jan. 7, 2010.

PCT International Search Report for International Application No. PCT/US2009/044422, dated Jan. 7, 2010.

* cited by examiner

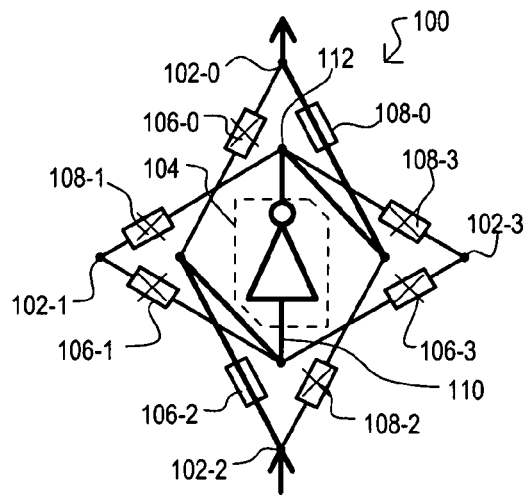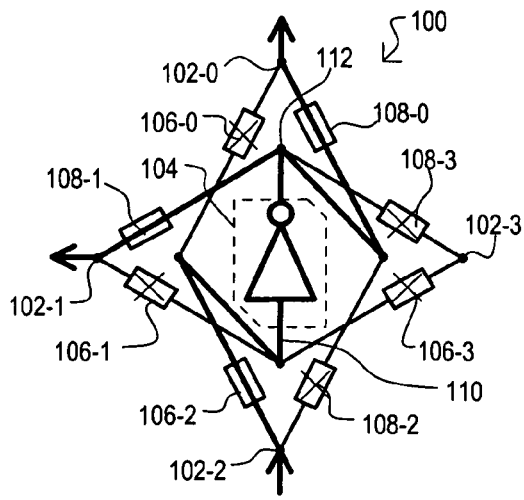
FIG. 2L    FIG. 3
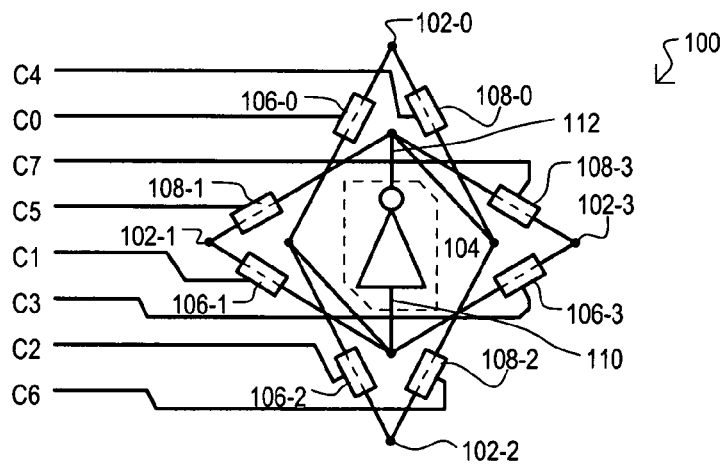
FIG. 4
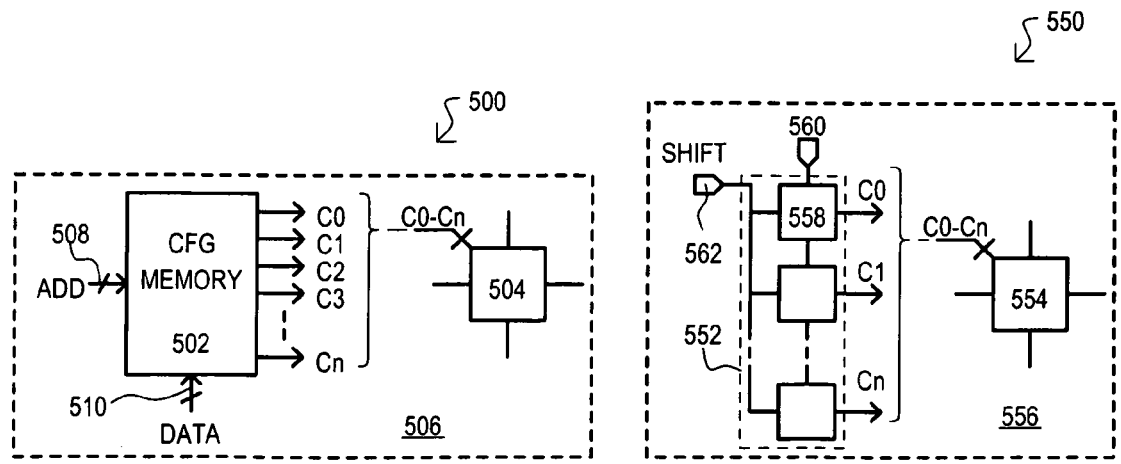
FIG. 5A    FIG. 5B

PROGRAMMABLE SWITCH CIRCUIT AND METHOD, METHOD OF MANUFACTURE, AND DEVICES AND SYSTEMS INCLUDING THE SAME

TECHNICAL FIELD

The present invention relates generally to semiconductor integrated circuit devices, and more particularly to switching circuits that can be programmed into different configurations, such as switching circuits included in programmable logic devices.

BACKGROUND OF THE INVENTION

Integrated circuit (IC) devices can include a number of sections formed in one or more substrates that are electrically interconnected to one another. In order to provide increased operating speeds, it is desirable to provide as fast a signal transmission speed as possible for signal paths that interconnect different sections. For some integrated circuit devices, critical timing paths can be identified prior to the fabrication of the device, and thus optimized (e.g., utilize large signal driving devices, minimize routing lengths, or increase signal line cross sectional size to reduce resistance).

However for other integrated circuit devices, signal paths can be configured after the device has been manufactured by connecting different signal paths with switches. In such cases, complete signal routing paths are unknown at the time of fabrication and thus cannot be optimized in the manner described above. Further, because the configuration of signal paths can depend upon a series of switches, signal switch construction can limit overall performance of such devices. For example, programmable logic devices (PLDs) can often include signal paths configurable by enabling (placing into a relatively low impedance state) or disabling (placing into a relatively high impedance state) various switching devices. Programmable logic devices can include, as but a few examples, complex PLDs (CPLDs) and programmable gate arrays (PGAs) including field PGAs (FPGAs).

Programmable logic devices can include various sections that provide programmable functions. Such sections can be interconnected to one another by signal lines disposed in different directions. In order to provide flexibility in routing paths it is desirable to provide switching circuits that can be programmed to connect one signal path disposed in one direction, to any of various signal paths disposed in the same or a different direction.

BRIEF SUMMARY OF THE INVENTION

The invention can include a switching circuit having a logic circuit input and a logic circuit output and at least three input transistors coupled to provide three separate paths between three input/output (I/O) nodes and the logic circuit input. The switching circuit can further include at least three output transistors coupled to provide three separate paths between the at least three I/O nodes and the logic circuit output.

The invention can also include an integrated circuit device having at least one switching circuit. Each switching circuit can include at least three input/output (I/O) nodes, each I/O node being coupled by two separate paths to an input and an output of a logic circuit by a corresponding different pair of switching circuits. The pairs of switching circuits are configurable to provide a signal path between at least any two I/O nodes, such signal path including the logic circuit.

The invention can further include a method of enabling signal paths in a programmable logic device. The method can include the steps of: for each of a plurality of switching circuits, each formed at the intersection of a different set of at least four different signal paths, providing separate controllable input paths between each different signal path and an input of a logic circuit of the switching circuit, and providing separate controllable output paths between each different signal path and an output of the logic circuit; and in response to configuration information, enabling one of the input paths to the logic circuit while disabling all other input paths, and disabling at least the output path for the signal path corresponding to the enabled input path.

BRIEF DESCRIPTION OF THE DRAWINGS

FIGS. 2A to 2L shows examples of various single signal path configurations for the switching circuit of FIG. 1.

FIG. 3 shows an example of a multiple signal path configuration for the switching circuit of FIG. 1.

FIG. 4 shows one example of configuration signals for the switching circuit of FIG. 1.

FIGS. 5A and 5B show two examples of embodiments that include storage circuits for providing configuration information to a switching circuit.

FIGS. 7A to 8B show examples of junction field effect transistor (JFET) devices that can be included in switching circuits according to embodiments of the invention.

DETAILED DESCRIPTION OF THE EMBODIMENTS

Various embodiments of the present invention will now be described in detail with reference to a number of drawings. The embodiments show structures, designs, and methods for configurable switching circuits that can be included in programmable logic devices, and the like, as well as integrated circuit devices and methods utilizing such switching circuits.

Figure 1:
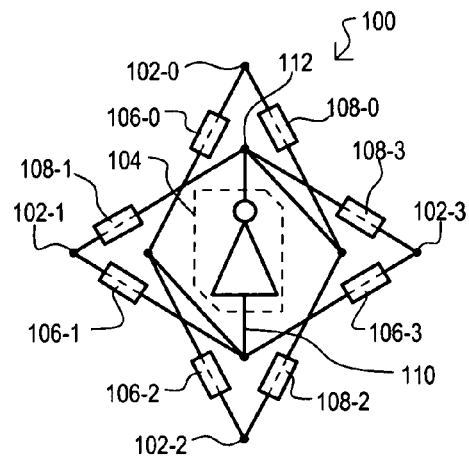
FIG. 1 is a block schematic diagram of a switching circuit according to a first embodiment of the present invention.

Referring now to FIG. 1, a switching circuit according to a first embodiment is shown in a block schematic diagram and designated by the general reference character 100. In the very particular example of FIG. 1, a switching circuit 100 can be a four-point switching circuit coupled between four input/output nodes (I/O) 102-0 to 102-3. Switching circuit 100 can provide a signal path between any one of the four I/O nodes and at least one other I/O node.

Referring still to FIG. 1, in the embodiment shown, a switching circuit 100 can include a logic circuit 104, input switch paths 106-0 to 106-3, and output switch paths 108-0 to 108-3. Logic circuit 104 can perform a predetermined logic function on an input signal received at a logic circuit input 110 to generate an output signal at a logic circuit output 112. In a preferred embodiment, logic circuit 104 can be an inverter. More preferably, logic circuit 104 can an inverter formed by logic junction field effect transistors (JFET). Even more preferably, such logic JFETs can have particular structure described in more detail at a later point herein.

Input switch paths (106-0 to 106-3) can each connect a different I/O node (102-0 to 102-3) to logic circuit input 110. Input switch paths (106-0 to 106-3) can be controllable, providing a relatively high impedance (are disabled) or provide a relatively low impedance (are enabled) in response to configuration information.

In a similar fashion, output switch paths (108-0 to 108-3) can each connect logic circuit output 112 to a different I/O node (102-0 to 102-3). Output switch paths (108-0 to 108-3) can also be controllable, providing a relatively high or low impedance in response to configuration information.

It is noted that switch paths (106-0 to 106-3, 108-0 to 108-3) can be conceptualized as being arranged into switch path pairs, each such pair providing separate paths between one I/O node (102-0 to 102-3) and a logic circuit input 110 and output 112. Such switch pairs would include 106-0/108-0, 106-1/108-1, 106-2/108-2 and 106-3/108-3.

In a preferred embodiment, each switch path (106-0 to 106-3, 108-0 to 108-3) can each include one or more switch JFETs, with a source-drain path of a switch JFET providing the low or high impedance. Preferably, each switch path (106-0 to 106-3, 108-0 to 108-3) can include no more than one switch JFET. Even more preferably, such switch JFETs can have particular structure described in more detail at a later point herein.

Having described structures of a switching circuit 100, various configurations for such a circuit will now be described with reference to FIGS. 2A to 2L. The configurations of FIGS. 2A to 2L show different single point-to-point configurations for switching circuit 100. That is, such configurations connect one I/O node (102-0 to 102-3) to only one other I/O node. However, as will be noted, alternate configurations can connect one I/O node to multiple other I/O nodes.

In FIGS. 2A to 2L, a particular convention is used to illustrate a configuration of a switching circuit 100. Switch paths (106-0 to 106-3, 108-0 to 108-3) are indicated as being enabled (e.g., providing a relatively low impedance path), by a line passing through such a path. In contrast, switch paths (106-0 to 106-3, 108-0 to 108-3) are indicated as being disabled (e.g., providing a relatively high impedance path), by an "X" being drawn through the switch path. Further, a resulting signal path is indicated by a bold line.

Figure 2A:
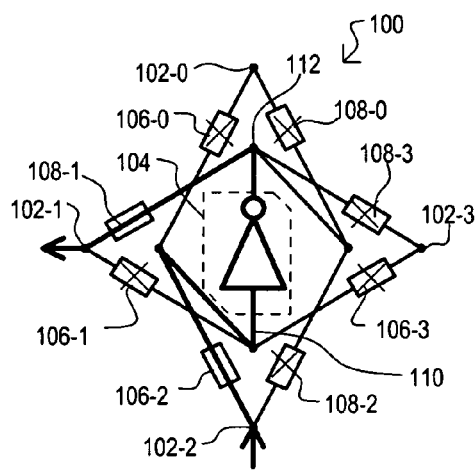
Figure 2B:
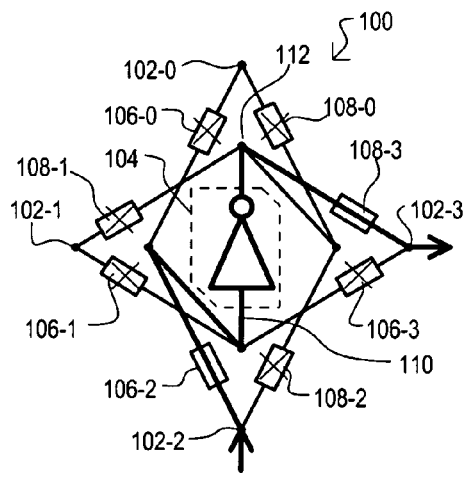
Figure 2C:
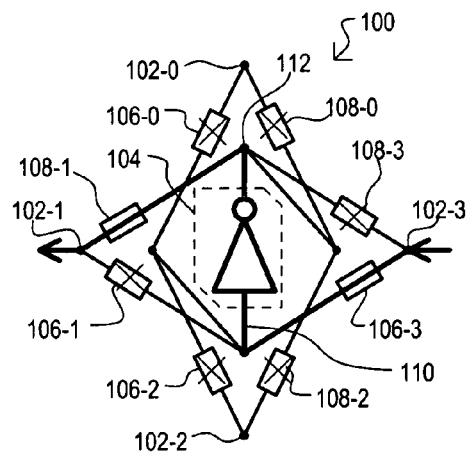
Figure 2D:
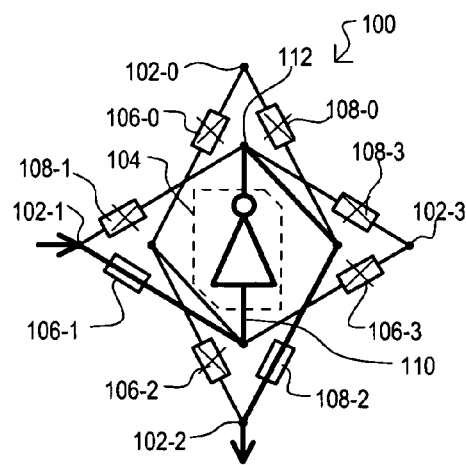
Figure 2E:
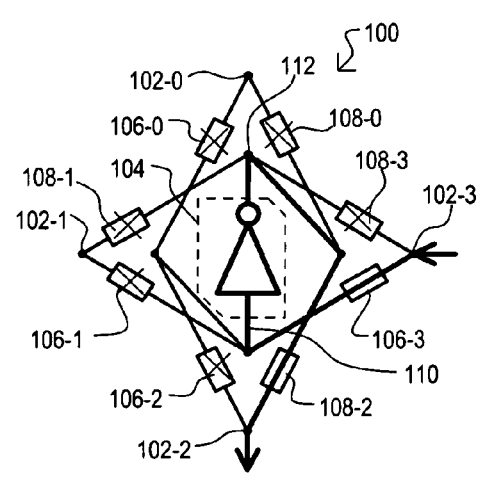
Figure 2F:
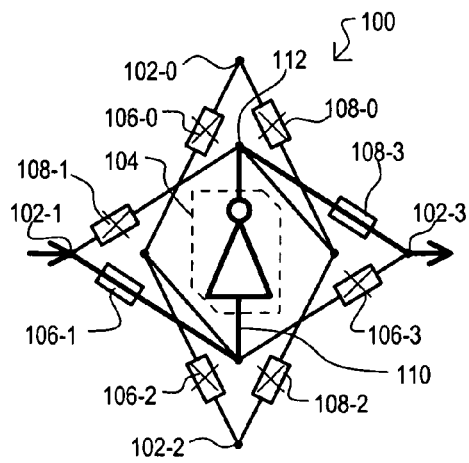
Figure 2G:
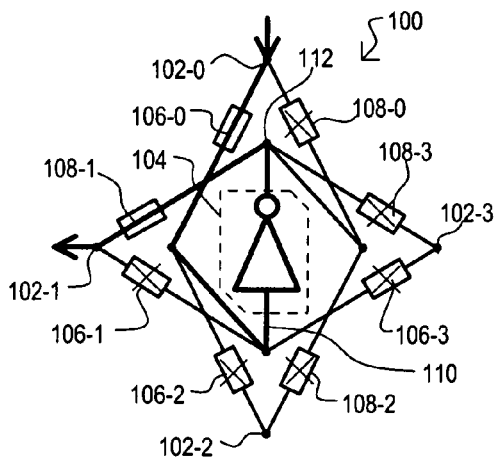
Figure 2H:
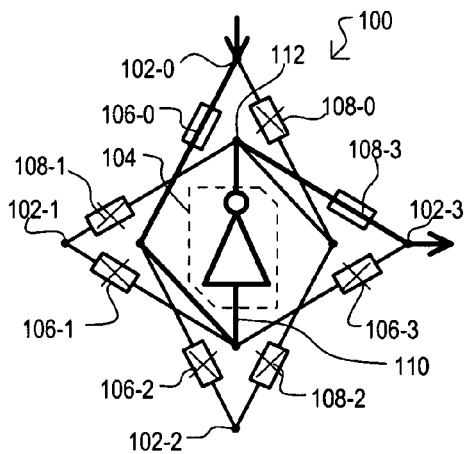
Figure 2I:
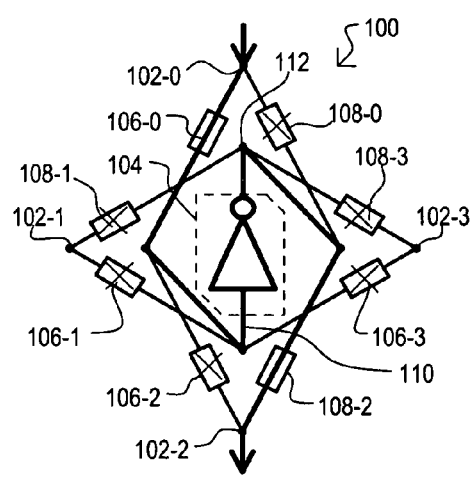
Figure 2J:
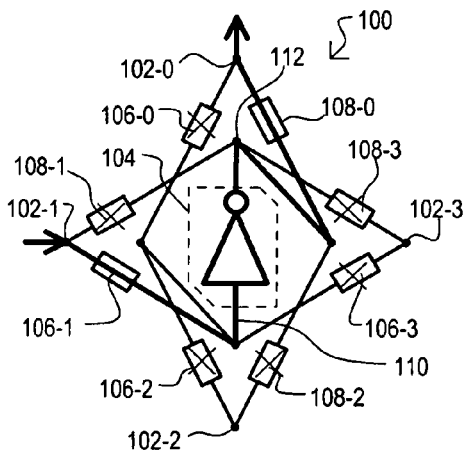
Figure 2K:
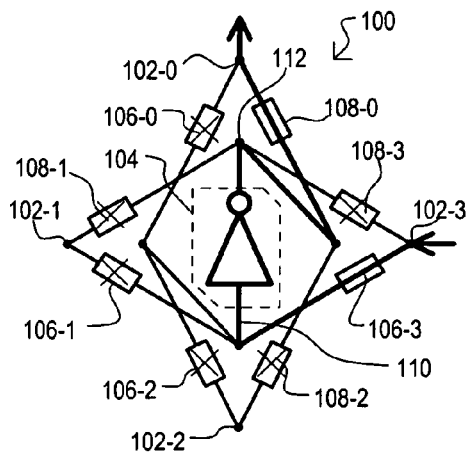

Referring now to FIG. 2A, a switching circuit 100 is shown configured to provide a signal path from I/O node 102-2 to I/O node 102-1. In such a configuration, input switch path 106-2 is enabled and output switch path 108-1 is enabled. All other switch paths (106-0,1,3 and 108-0,2,3) are disabled. As a result, a signal path can be created that originates at I/O node 102-2 and travels through input switch path 106-2 to logic circuit input 110. Thus, the signal path travels through logic circuit 104. The signal path continues from logic circuit output 112, travels through output switch 108-1, to end at I/O node 102-1.

The remaining examples, shown in FIGS. 2B to 2L show various configurations for connecting any one I/O node to any other one I/O node. The operation of switch paths (106-0-3 and 108-0-3) and a resulting signal path are described using the same convention as FIG. 2A, and so can be understood from the description of FIG. 2A.

While FIGS. 2A to 2L have shown single point-to-point configurations for switching circuit 100, such a circuit may also be configured to connect one I/O node to multiple I/O nodes. One such configuration is shown in FIG. 3.

Referring now to FIG. 3, a switching circuit 100 is shown configured to provide a signal path from I/O node 102-2 to both I/O nodes 102-0 and 102-1. In such a configuration, input switch path 106-2 is enabled, while both output switch paths 108-0 and 108-1 are enabled. All other switch paths (106-0,1,3 and 108-2,3) are disabled. As a result, a signal path can be created that originates at I/O node 102-2 and travels through input switch path 106-2 through logic circuit 104. The signal path continues from logic circuit output 112, through both output switches 108-0 and 108-1, to I/O nodes 102-0 and 102-1.

From the above description, it is understood that switching circuit 100 can be configured to connect one I/O node to any or all of the other I/O nodes. In all such various configurations, it is understood that the output switch corresponding to the enabled input switch is always disabled. For example, in FIG. 3, the input switch path 106-2 is enabled, thus corresponding output switch path 108-2 is disabled.

In this way, a switch circuit can provide a signal path for an electrical signal to travel from any one I/O node, to one or more other I/O nodes. It is noted that the utilization of JFET devices as switch paths can result in advantageously low impedance signal paths.

Still further, in the arrangement shown in FIGS. 1-3, each signal path created includes a logic circuit, e.g., an inverter. As a result, each time a signal is transmitted through such a switching circuit, it can be re-driven at full signal amplitude. This is in contrast to conventional arrangements that form switch paths that pass through circuit paths, such as insulated gate field effect transistor source-drain paths, without being re-driven. In such conventional arrangements, significant reductions in signal amplitude can occur, particularly, when the signal passes through multiple conventional switching circuits.

As noted above, a switching circuit according to embodiments of the invention can be placed into various configurations in response to configuration data. One particular arrangement of providing configuration data to a switching circuit is shown in FIG. 4.

Referring to FIG. 4, configuration signals for a switching circuit like that of FIG. 1 are shown in a block schematic diagram. In the particular arrangement shown, a switching circuit 100 can receive a different configuration signal for each switch path. In particular, configuration signals C0-C3 can be applied to input switch paths 106-0-3, respectively, while configuration signals C4-C7 can be applied to output switch paths 108-0-3, respectively. According to such configuration signals (C0-C7), each switch path (106-0-3 and 108-0-3) can be enabled or disabled, to place switching circuit 100 in to a desired configuration. As but one example, to place switching circuit 100 into the configuration shown in FIG. 2A, signals C2 and C5 would be active (at a level that places their corresponding switch paths into a relatively low impedance state), while the remaining signals C0-C1, C3-C4 and C6-C7 can be inactive (at a level(s) that places their corresponding switch paths into a relatively high impedance state).

In this way, configuration signals can be applied to a switching circuit 100 to place such a circuit into any number of desired configurations.

Configuration signals for switching circuit shown herein may originate from various sources. For example, if a switching circuit is formed in an integrated circuit, configuration signals for such a circuit can be signals received from a source external to the integrated circuit. However, preferably, a storage circuit formed in the same integrated circuit as the switching circuit, can be provided for storing configuration data for generating such configuration signals. Two examples of storage circuit arrangements are shown in FIGS. 5A and 5B.

Referring to FIG. 5A, an integrated circuit according to an embodiment is shown in top plan view and designated by the general reference character 500. An integrated circuit 500 can include a configuration memory 502 and one or more switching circuits 504 formed in a common substrate 506. A configuration memory 502 can include a number of storage locations that can store a bit value corresponding to a configuration signal. In the arrangement of FIG. 5A, configuration memory 502 provides configuration signals C0 to Cn. In addition, configuration memory 502 can include an address input 508 and well as a data input 510. In response to values received at address input 508, data values present at data input 510 can be stored at predetermined locations within configuration memory 502. Such stored values can be output as all, or a portion of configuration signals C0 to Cn. A configuration memory 502 can take various forms, including but not limited to a random access memory (RAM), programmable read only memory (PROM), including EEPROMs and/or a collection of addressable registers. Similarly, storage circuits within configuration memory 502 can be based on dynamic RAM cells, static RAM cells, or a nonvolatile memory cell technology. Optionally, a data input 510 may also serve as a data output, to enable configuration data to be read from integrated circuit 500.

Configuration signals C0 to Cn from configuration memory 502 can be applied directly or by way of intervening circuitry to switching circuit 504. A switching circuit 504 can take the form of any of the switching circuits shown herein, or equivalents.

While data values can be written in parallel to addressable locations, as shown in FIG. 5A, alternatively, data values can be received in a serial fashion. One such arrangement is shown in FIG. 5B.

Referring to FIG. 5B, an integrated circuit according to another embodiment is shown in top plan view and designated by the general reference character 550. Like the arrangement of FIG. 5A, an integrated circuit 550 can include a configuration memory 552 and one or more switching circuits 554 formed in a common substrate 556. However, unlike FIG. 5A, a configuration memory 552 can include a serial shift register having a number of registers (one shown as 558) arranged in series with one another, each such register providing a configuration signal C0 to Cn. Configuration data received at a data input 560 can be shifted into and out of such registers in a serial fashion according to a shift signal SHIFT, received at a shift input 562.

As in the case of FIG. 5A, configuration signals C0 to Cn from configuration memory 552 can be applied directly or by way of intervening circuitry to switching circuit 554. Further, a switching circuit 554 can take the form of any of the switching circuits shown herein, or equivalents.

As noted above, switch paths included in switching circuits according to the embodiments shown can preferably include one or more JFETs. Various examples of such switch paths are shown in FIGS. 6A to 6M.

Figures 6A, 6B, 6C, 6D, 6E:
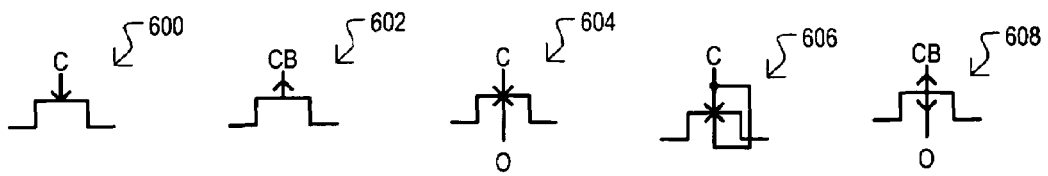
FIGS. 6A to 6M show examples of switch paths that can be included in switching circuits according to embodiments of the invention.

Referring to FIG. 6A, a switch path according to a first embodiment is shown in a schematic diagram and designated by the general reference character 600. A switch path 600 can include an n-channel JFET with a gate connected to receive a configuration signal (shown as C in this example). It is understood that the source-drain path of the JFET can be arranged between an I/O node and an input or output of a corresponding logic circuit. N-channel JFET can be an enhancement mode JFET. That is, absent a gate voltage, a source-drain path can have a relatively high impedance. Upon application of a sufficiently positive gate-to-source voltage, such a source-drain path can be placed into a relatively low impedance state. Attentively, the n-channel JFET of switch path 600 can be a depletion mode device that provides a low impedance absent a gate voltage, and high impedance upon application of a negative gate-to-source voltage.

Referring to FIG. 6B, another example of a switch path is shown as 602. Switch path 602 can have the same general arrangement as FIG. 6A, but can include a p-channel JFET. Such a p-channel JFET can also be either an enhancement mode or depletion mode JFET.

In this way, a switch path can be formed by a JFET.

The examples of FIGS. 6A and 6B show single control terminal JFETs. However, alternate switch path structures can include dual gate JFETs. Various examples of such arrangements are shown in FIG. 6C to 6F.

Referring to FIG. 6C, a switch path according to another embodiment is shown in a schematic diagram and designated by the general reference character 604. A switch path 604 can include an n-channel JFET having a first control gate and a second control gate. A first control gate can receive a configuration signal C, while a second control gate can receive a mode signal O. A source-drain path can be arranged between an I/O node and an input or output of a corresponding logic circuit. Because the JFET of switch path 604 includes two control gates, a resulting source-drain impedance can be controlled according to both such signals.

Referring to FIG. 6D, a switch path according to another embodiment is shown in a schematic diagram and designated by the general reference character 606. FIG. 6D shows the same general arrangement as FIG. 6C, but with both first and second control gates being commonly controlled by a same signal C.

Figures 6F, 6G, 6H, 6I:
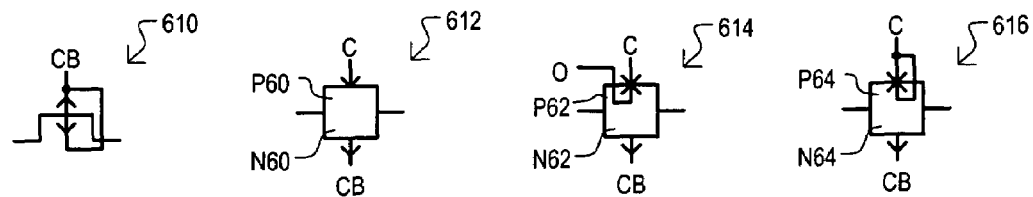

FIGS. 6E and 6F show the same general arrangement as FIGS. 6C and 6D, but include a dual gate p-channel JFET rather than an n-channel JFET.

In this way, a switch path can be formed by a dual gate JFET.

It is noted that in preferred embodiments, each switch path of a switching circuit can include but one JFET. Such an arrangement provides for an advantageously compact switching circuit.

While switch paths can be formed with single JFETs, alternate arrangements can include multiple JFETs. Various examples of such arrangements are shown in FIGS. 6G to 6M.

Referring to FIG. 6G, a switch path according to yet another embodiment is shown in a schematic diagram and designated by the general reference character 612. A switch path 612 can include two JFETs, of different conductivity types, having source-drain paths arranged in parallel with one another. In particular, switch path 612 can include an n-channel JFET N60 having a source-drain path in parallel with that of a p-channel JFET P60. A conductivity of JFETs N60 and P60 can be controlled according to configuration signals C and CB, respectively, which may, or may not be complements of one another.

FIGS. 6H and 6I show an arrangement like that of FIG. 6G, but with n-channel NJFETs like those of FIGS. 6C and 6D, respectively.

Figures 6J, 6K, 6L, 6M:
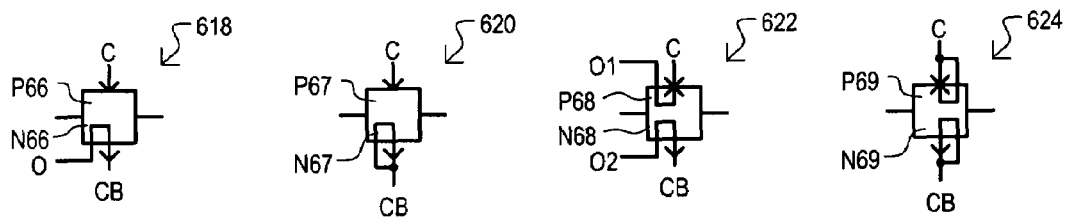

Similarly, FIGS. 6J and 6K show an arrangement like that of FIG. 6G, but with p-channel JFETs like those of FIGS. 6E and 6F, respectively.

FIG. 6L shows an arrangement like that of FIG. 6G, but with an n-channel JFET like that of FIG. 6C and a p-channel JFET like that of FIG. 6E.

FIG. 6M shows another arrangement like that of FIG. 6G, but with an n-channel JFET like that of FIG. 6D and a p-channel JFET like that of FIG. 6F.

In this way, switch paths of a switching circuit can include various combinations of multiple JFETs of different conductivity types.

Particular JFET structures for JFETs included in switching circuit according to embodiments will now be described.

Figures 7A, 7B:
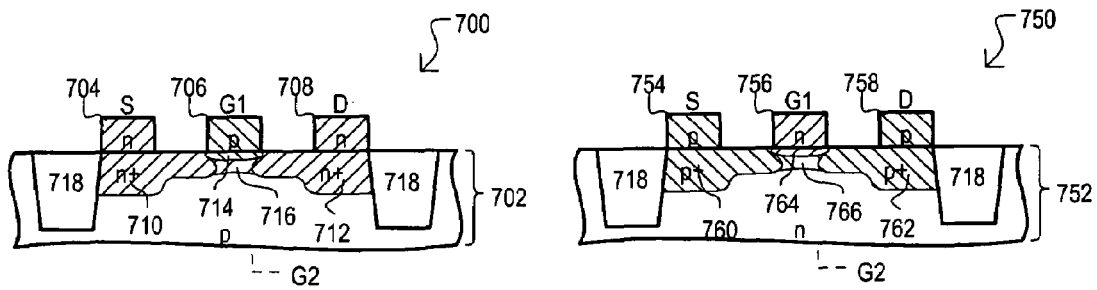

Referring to FIG. 7A, one example of an n-channel JFET that can be included in embodiments of the invention is shown in a side cross sectional view, and designated by the general reference character 700. An n-channel JFET 700 can be formed in a semiconductor substrate 702, and include a source electrode 704, gate electrode 706, and drain electrode 708.

As but two examples, a substrate 702 can be a p-type region in a p-type bulk substrate or a p-well formed within an n-type region, such as an n-well.

Electrodes (704, 706 and 708) can be formed from a semiconductor material and in contact with a surface of semiconductor substrate 702. Preferably, electrodes (704, 706 and 708) can be formed from a common semiconductor layer deposited on semiconductor substrate 702, more preferably a layer of doped polycrystalline silicon. For the case of the n-channel JFET 700 source and drain electrodes (704 and 708) can be doped to an n-type conductivity, while gate electrode 706 can be doped to a p-type conductivity.

Within semiconductor substrate 702, n-channel JFET 700 can further include a source substrate region 710, a drain substrate region 712, a gate substrate region 714, and a channel region 716. Source and drain substrate regions (710 and 712) can be doped to an n-type conductivity, and are preferably formed by a combination of ion implantation and out-diffusion of dopants from source and drain electrodes (704 and 708). A gate substrate region 714 is doped to a p-type conductivity and is preferably formed by an outdiffusion of dopants from gate electrode 706. A channel region 714 can be a portion of substrate 702 below gate substrate region 714 and between source and drain substrate regions (710 and 712). A channel region 716 can be doped to an n-type conductivity, but have a substantially lower concentration than source and drain substrate regions (710 and 712). Preferably, a substrate 702 can include monocrystalline silicon, and include isolation structures 718 that can provide electrical isolation between adjacent devices.

In such an arrangement, a first control gate structure can include gate electrode 706 and corresponding gate substrate region 714. Similarly, a source can include source electrode 704 and corresponding source substrate region 710, while a drain can include a drain electrode 708 and corresponding drain substrate region 712.

Optionally, the p-type region of substrate 702 formed below channel region 716 can be separately driven and thus form a second control gate in addition to a first control gate.

Referring to FIG. 7B, one example of a p-channel JFET that can be included in embodiments of the invention is shown in a side cross sectional view, and designated by the general reference character 750. A p-channel JFET 750 can include some of the same general items as n-channel JFET 700, thus like items are referred to by the same reference character but with reference characters starting with digits "75" and "76", instead of "70" and "71", respectively. Further, as shown in FIG. 7B, conductivity types are switched for substrate region 752, electrode structures (754, 756, 758), substrate regions (760, 762, 764) and channel region 766.

A substrate 752 can be an n-well formed in a p-type substrate, such as a p-type region formed in a p-type bulk, or a p-well formed in an n-well.

Figures 8A, 8B:
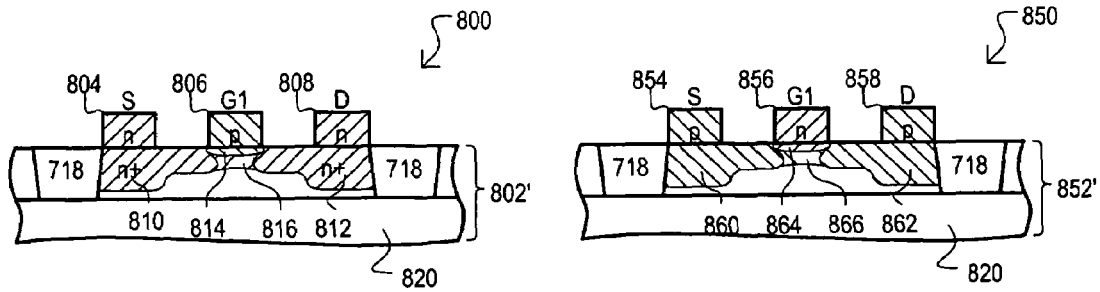

FIG. 8A shows another example of an n-channel JFET that can be included in embodiments of the invention. FIG. 8A shows the same general arrangement as that shown in FIG. 7A, thus like structures have the same reference characters but with the first digit being an "8" instead of a "7". Unlike FIG. 7A, n-channel JFET 800 is formed on a silicon-on-insulator (SOI) substrate 802'. SOI substrate can include a lateral isolation layer 820.

FIG. 8B shows another example of a p-channel JFET that can be included in embodiments of the invention. FIG. 8B shows the same general arrangement as that shown in FIG. 7B, thus like structures have the same reference characters but with the first digit being an "8" instead of a "7". As in the case of FIG. 8A, p-channel JFET 850 is formed on a silicon-on-insulator (SOI) substrate 852'.

JFETs having the structures like those shown in FIGS. 7A to 8B can advantageously be constructed to provide enhancement mode or depletion modes of operation. Further, such structures do not include a gate insulator, as in the case of insulated gate field effect transistors (e.g., MOSFETs), which can require more complex manufacturing process. Further, such devices can enable operating voltages far below that of MOSFETs (e.g., less than 0.7 volts).

While JFETs are preferably utilized to form all or a portion of switch paths for switching circuit according the various embodiments, JFETs can also be utilized to form logic circuits for such switching devices. Various examples of such arrangements will now be described.

Figure 9:
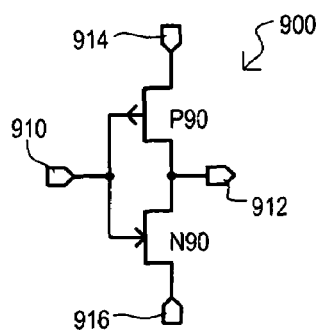
FIG. 9 shows one example of a logic circuit that can be included in switching circuits according to embodiments of the invention.

Referring now to FIG. 9, a logic circuit that can be included in switching circuits of the embodiments is shown in a schematic diagram and designated by the general reference character 900. A logic circuit 900 can include a logic circuit input 910 and a logic circuit output 912. In the particular example shown, a logic circuit 900 can be an inverter formed with a p-channel JFET P90 and an n-channel JFET N90. JFET P90 can have a source connected to a high power supply node 914, a drain connected to logic circuit output 912, and a gate connected to logic circuit input 910. JFET N90 can have a source connected to a low power supply node 916, a drain connected to logic circuit output 912, and a gate connected to logic circuit input 910. Preferably, both JFET P90 and N90 can operate as enhancement mode devices.

A logic circuit like that shown in FIG. 9 can be conceptualized as having an "active" load, in that when JFET N90 turns on, device P90 can actively turn off, and vice versa. Such an arrangement can provide advantageously low power consumption as one device can always have a high impedance when not switching between states. However, alternate embodiments can utilize a passive load type inverter. One such arrangement is shown in FIG. 10.

Figure 10:
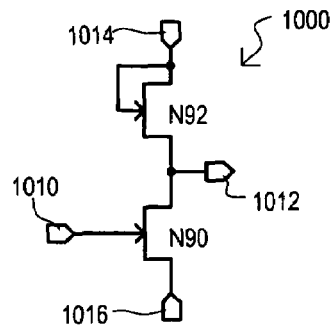
FIG. 10 shows another example of a logic circuit that can be included in switching circuits according to embodiments of the invention.

Referring now to FIG. 10, another logic circuit that can be included in switching circuits of embodiments is shown in a schematic diagram and designated by the general reference character 1000. A logic circuit 1000 can include a logic circuit input 1010 and output 1012. In the particular example shown, a logic circuit 1000 can be an inverter formed with an n-channel JFET N90 operating as a pull down device and an n-channel JFET N92 configured as a passive load.

In this way, a logic circuit formed with JFET devices can have JFETs configured as active or passive loads.

Figure 11:
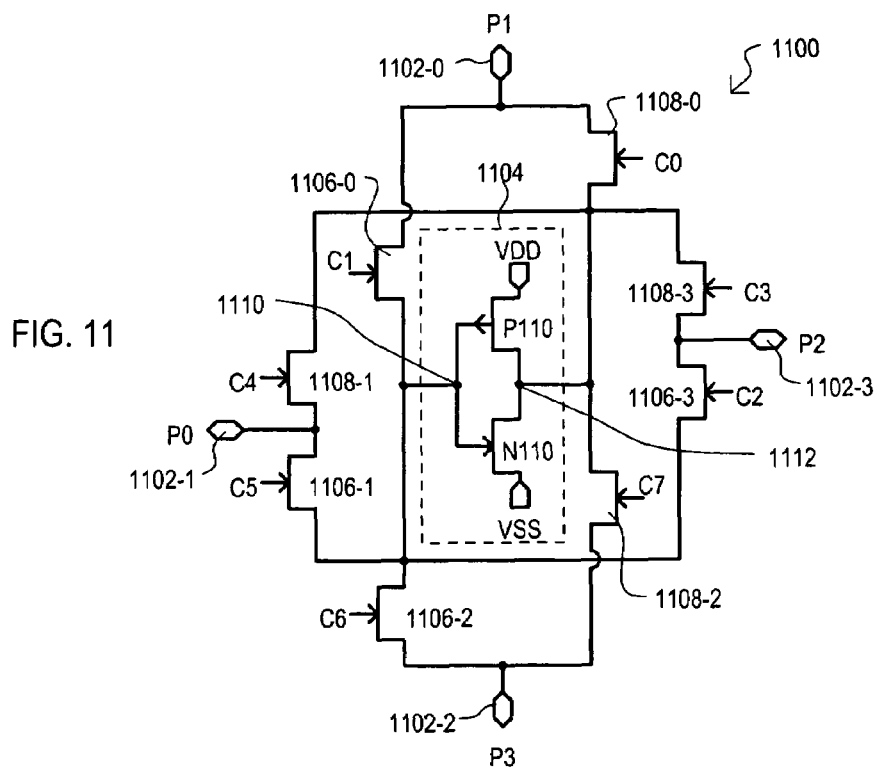
FIG. 11 is a schematic diagram of switching circuit according to one particular embodiment of the invention.

Referring now to FIG. 11, one very particular example of a switching circuit according to an embodiment is shown in a schematic diagram and designated by the general reference character 1100. Switching circuit 1100 can have the same general sections as that shown in FIG. 1, thus like sections are shown with the same reference character but with the leading first digits being "11" instead of "1". In one very particular arrangement, FIG. 11 can be one particular implementation of the embodiment shown in FIG. 1.

In the embodiment of FIG. 11, each switch path (1106-0-3 and 1108-0-3) can be formed with a single n-channel JFET. Further, logic circuit 1104 can be inverter formed with complementary conductivity JFETs, like that shown in FIG. 9. Such an arrangement can advantageously provide a compact circuit structure occupying relatively little circuit area, as it includes but 10 JFET devices. It is noted that such a circuit provides both configurability for signal paths originating at any one I/O node (1102-0 to 1102-3) to any one or more other I/O nodes, as well as signal driving in such paths (to maintain signal amplitude).

In this way, in one embodiment, a switching circuit can be formed of active device consisting only of JFETs.

While various embodiments described above have shown switching circuits that include an inverter as a logic circuit, alternate embodiments can include different types of logic circuits for inclusion in signal paths between I/O nodes. Two examples of possible variations are shown in FIGS. 12 to 13B.

Figure 12:
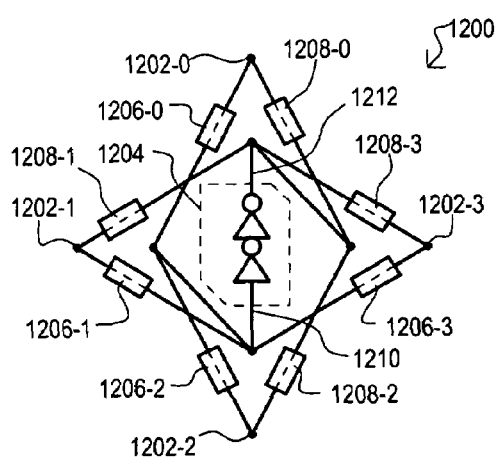
FIG. 12 is a block schematic diagram of a switching circuit according to a further embodiment of the invention.

Referring to FIG. 12, a switching circuit is shown in a block schematic diagram and designated by the general reference character 1200. A switching circuit 1200 can have the same general configuration as FIG. 1, but has a logic circuit 1204 includes two series connected inverters rather than a single inverter. Such an arrangement can provide various switch path configurations without inverting an incoming signal. Such an arrangement can advantageously allow switching circuit 1200 to be directly substituted for non-inverting switching elements of existing architectures.

In one embodiment, both inverters of logic circuit 1204 can have a structure like that shown In FIG. 9.

Figure 13A:
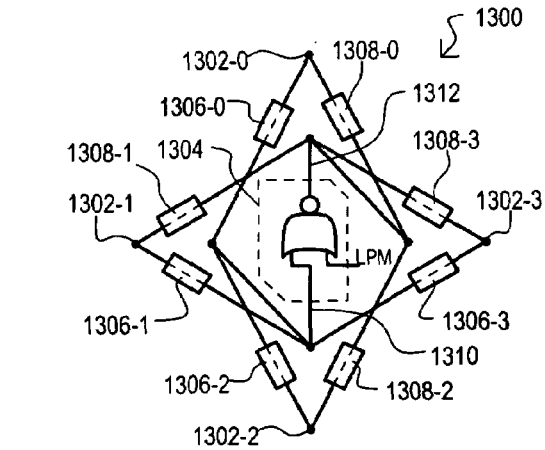
FIG. 13A is a block schematic diagram of another switching circuit according to an embodiment of the invention.
Figure 13B:
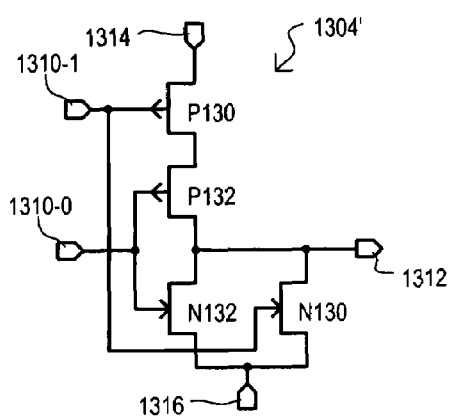
FIG. 13B is a schematic diagram of logic circuit that can be included in the embodiment of FIG. 13A.

Referring to FIG. 13A, another switching circuit is shown in a block schematic diagram and designated by the general reference character 1300. A switching circuit 1300 can have the same general configuration as FIG. 1, but has a logic circuit 1304 that includes a two input NOR gate. Such an arrangement can allow a switching circuit 1300 to be placed in a predetermined state in response to a mode signal LPM. In the particular arrangement shown, when signal LPM is high, a logic circuit output 1312 can be forced low. FIG. 13B shows one particular example of a NOR gate that can be included in switching circuit 1300, designated by the reference character 1304'. A NOR gate 1304' can include p-channel enhancement mode JFETs P130 and P132 and n-channel enhancement node JFETs N130 and N132. JFETs P130 and P132 can have source-drain paths arranged in series between a high power supply node 1314 and a logic circuit output 1312. Gates of JFET P130 and P132 can be connected to logic circuit inputs 1310-1 and 1310-0, respectively. JFETs N130 and N132 can have source-drain paths arranged in parallel between a low power supply node 1316 and a logic circuit output 1312. Gates of JFET N130 and N132 can be connected to logic circuit inputs 1310-1 and 1310-0, respectively.

In this way, in particular embodiments, a switching circuit can include a logic circuit other than an inverter that drives signals between an input I/O node and an output I/O node, but is controllable by a signal separate from those received at I/O nodes.

Figure 14A:
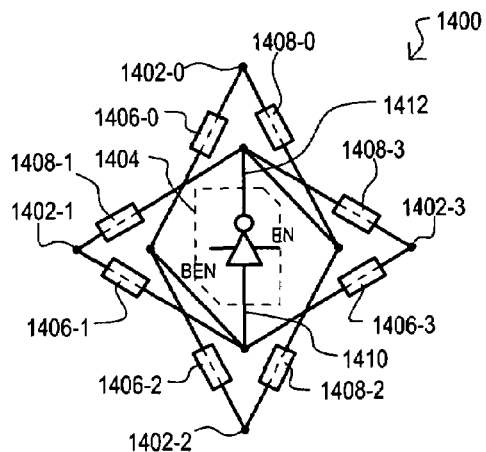
FIG. 14A is a block schematic diagram of yet another switching circuit according to an embodiment of the invention.

Referring to FIG. 14A, a switching circuit according to still another embodiment is shown in a block schematic diagram and designated by the general reference character 1400. A switching circuit 1400 can have the same general configuration as FIG. 1, but include a logic circuit 1404 having tri-statable logic. Tri-statable logic 1404 can be configured to drive a logic circuit output 1412 between a logic low level (e.g., a low power supply level) and a logic high level (e.g., a high power supply level) in response to one or more predetermined input signals. In addition, tri-statable logic 1404 can drive a logic circuit output 1412 into a high impedance state. In the particular example shown, a logic circuit 1404 includes a tri-statable inverter. When signals EN and BEN have one set of values, logic circuit 1404 can operate as an inverter. However, when signals EN and BEN have another set of values, logic circuit 1404 can place a logic circuit output 1412 into a high impedance state regardless of a signal value received at logic circuit input 1410.

Figure 14B:
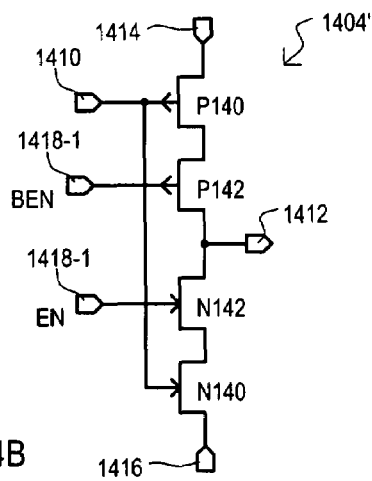
FIG. 14B is a schematic diagram of logic circuit that can be included in the embodiment of FIG. 14A.

FIG. 14B shows on particular example of tri-statable logic that can be included in logic circuit 1404, designated by the reference character 1404'. Tri-statable logic 1404' can be a tri-statable inverter having a similar arrangement to that shown in FIG. 9. However, unlike FIG. 9, tri-statable logic 1404' can include a p-channel JFET P142 having a source-drain path connected between logic circuit output 1412 and a drain of transistor P140, and an n-channel JFET N412 having a source-drain path connected between logic circuit output 1412 can a drain of transistor N140. JFET P142 can receive a signal BEN at its gate, while JFET N142 can receive a signal EN at its gate. When logic circuit 1404' is configured in a "standard" mode of operation, a signal BEN can place transistor P142 into a low impedance state and signal EN can place transistor N142 into a low impedance state. However, when logic circuit 1404' is configured into a high impedance mode of operation, a signals BEN and EN can place transistors P142 and N142 into high impedance states.

In one particular arrangement signal BEN can be driven to a level higher than a standard logic level to place transistor P142 into a very high impedance state and/or signal BEN can be driven to a level lower than a standard logic level (e.g., level of a signal received a logic circuit input 1410) to place transistor P142 into a very low impedance state. In a similar fashion, signal EN can place transistor N142 into a low or high impedance state depending upon mode of operation (e.g., standard or high impedance). Further, signal EN can be driven to levels outside of a standard logic level to place transistor N142 into a very low and/or very high impedance state. Placing transistors P142 and N142 into very high impedance states can allow a switching circuit to enter a very low power state, by reducing the current drawn by the logic circuit.

While embodiments above have shown switching circuits that can connect between four I/O nodes (e.g., four-point switches), it may be desirable to provide arrangements that allow for switching between three points. In particular, intersections of signal lines on an edge of a programmable logic device array may be formed at the intersection of three lines.

Figure 15:
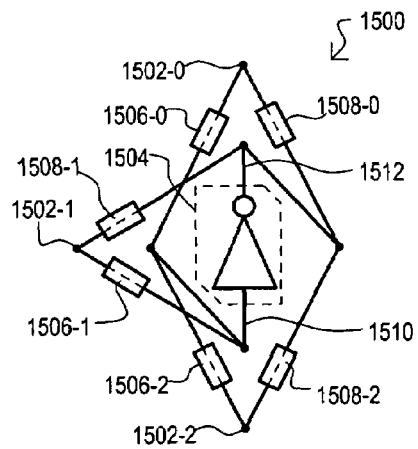
FIG. 15 is a block schematic diagram of a switching circuit according to another embodiment of the invention.

Referring to FIG. 15, another embodiment is shown in a block schematic diagram and designated by the general reference character 1500. A switching circuit 1500 can include some of the same general sections as that shown in FIG. 1, thus like sections are referred by the same reference characters but with the first digits being "15" instead of "1". Unlike the arrangement of FIG. 1, the embodiment of FIG. 15 can provide configurable signal paths between three I/O nodes, rather than four.

Various configurations for switching circuit 1500 are understood with reference to FIGS. 2A to 3.

Figure 16:
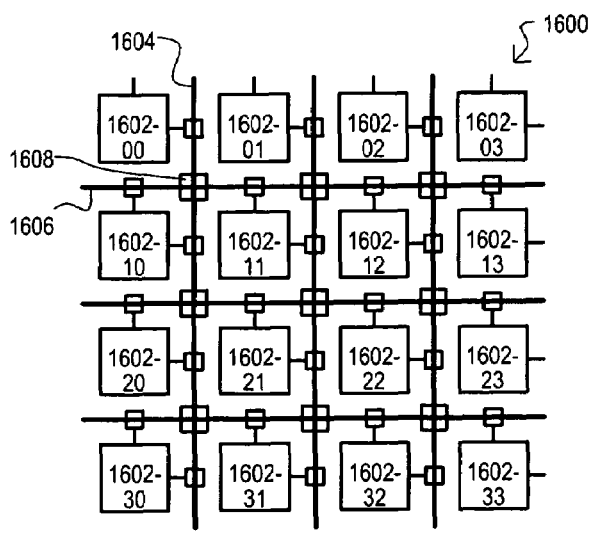
FIG. 16 is a block schematic diagram of an integrated circuit according to an embodiment of the invention.
Figure 17:
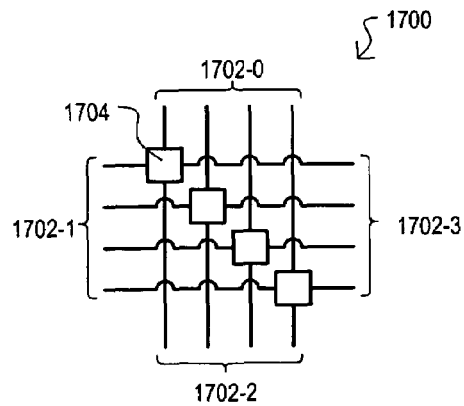
FIG. 17 is a block schematic diagram showing one example of a switching section of the embodiment shown in FIG. 16.

While the switching circuits disclosed herein can be advantageously employed in various integrated circuit architectures to provide programmable signal paths, in a preferred embodiment, such switching circuits are included in a programmable logic device. An example of such an arrangement is shown in FIGS. 16 and 17. FIG. 16 shows an example of a programmable logic device 1600, in particular, a field programmable gate array (FPGA) having programmable function sections 1602-00 to 1602-33. Programmable function sections (1602-00 to 1602-33) can provide a predetermined function based on configuration data. Programmable function sections (1602-00 to 1602-33) can also be interconnected by signal lines groups traveling in a first direction and second direction.

By way of example, a first signal line group is shown as 1604 and is disposed in a vertical direction of FIG. 16, while as second signal line group is shown as 1606, and is disposed in the horizontal direction in FIG. 16.

Switching sections can be formed at intersections of signal line groups. By way of example one such switching section is shown as 1608. Such switching sections can allow signal line groups to be interconnected with one another to create signal paths that travel in the various available directions. Such configurability can be provided by switching circuits according to any of the embodiments shown in herein, or equivalents.

Referring to FIG. 17, one very a particular example of a switching section, like that shown as 1608 in FIG. 16, is shown in a block schematic diagram and designated by the general reference character 1700. A switching section 1700 can be formed at an intersection of four signal lines groups 1702-0 to 1702-3. Further, a switching section 1700 can include switching circuits (one shown as 1704) that allow each signal line from the signal line groups (1702-0 to 1702-3) to be connected to one or more signal lines of any of the other signal line groups. Any or all of switching circuits (e.g., 1704) can be a switching circuit according to an embodiment shown herein, or equivalents. Of course while FIG. 17 shows signal line groups (1702-0 to 1702-3) of four, this is by way of example only.

In this way, a programmable logic device, such as an FPGA can include switching circuits that provide advantageously compact size and/or improved signal amplitude response or signal speed, for improved device performance.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element.

While various particular embodiments set forth herein have been described in detail, the present invention could be subject to various changes, substitutions, and alterations without departing from the spirit and scope of the invention.

What is claimed is:

1. A switching circuit, comprising:
a logic circuit having a logic circuit input and a logic circuit output, the logic circuit comprising a first logic junction field effect transistor (JFET) of a first conductivity type and a second logic JFET of a second conductivity type;
at least three input transistors coupled to provide three separate paths between at least three input/output (I/O) nodes and the logic circuit input; and
at least three output transistors coupled to provide three separate paths between the at least three I/O nodes and the logic circuit output.

2. The switching circuit of claim 1, wherein:
at least one of the at least three input transistors comprises a junction field effect transistor (JFET) having a source-drain path coupled between one of the at least three I/O nodes and the logic circuit input.

3. The switching circuit of claim 1, wherein:
at least one of the at least three output transistors comprises a junction field effect transistor (JFET) having a source-drain path coupled between one of the at least three I/O nodes and the logic circuit output.

4. The switching circuit of claim 1, wherein:
at least one of the input or output transistors comprises a junction field effect transistor (JFET) having a top gate electrode formed from a semiconductor material doped to a first conductivity type formed on and in contact with a surface of a semiconductor substrate.

5. The switching circuit of claim 1, further including:
a storage section that includes a different storage circuit coupled to each input and output transistor.

6. The switching circuit of claim 5, wherein:
the storage circuit comprises a shift register circuit having a plurality of registers coupled in series with one another, and commonly coupled to advance a data value to a next register in the series in response to a shift control signal, each storage circuit comprising at least one of the registers of the shift register circuit.

7. The switching circuit of claim 4, wherein:
the at least one in input or output transistor further comprises a source electrode and a drain electrode patterned from the semiconductor material and formed on and in contact with the surface of the semiconductor substrate, and a source substrate region formed in the substrate including between the gate electrode and source electrode.

8. An integrated circuit device, comprising:
at least one switching circuit, each switching circuit including at least three input/output (I/O) nodes, each I/O node being coupled by two separate paths to an input and an output of a logic circuit by a corresponding different pair of switching paths, the pairs of switching paths being configurable to provide a signal path between at least any two I/O nodes, the signal path traveling through the logic circuit, and each different pair of switching paths including at least one in input junction field effect transistor (JFET) having a source-drain path coupled between the in input of the logic circuit and the corresponding I/O node.

9. The integrated circuit of claim 8, wherein:
the logic circuit of each switching circuit comprises an inverter.

10. The integrated circuit of claim 9, wherein:
each inverter comprises at least two inverter junction field effect transistors (JFETs) having source-drain paths the arranged in series with one another, and commonly coupled to the output of the logic circuit.

11. The integrated circuit of claim 8, wherein:
each different pair of switching paths further comprises at least one output JFET having a source-drain path coupled between the output of the logic circuit and the corresponding I/O node.

12. The integrated circuit of claim 8, wherein:
the at least one in input JFET comprises a gate electrode and a drain electrode patterned from the semiconductor material and formed on and in contact with the surface of the semiconductor substrate, and a drain substrate region formed in the substrate including between the gate electrode and drain electrode.

13. The integrated circuit of claim 8, further including:
a plurality of first conductive lines;
a plurality of second conductive lines;
a plurality of third conductive lines;
a plurality of fourth conductive lines; and
the at least one switching circuit comprises a plurality of switching paths formed at an intersection of the first, second, third and fourth conductive lines, each switching circuit providing a configurable signal path between a different one of the first, second, third and fourth conductive lines.

14. The integrated circuit of claim 13, further including:
a plurality of programmable logic circuit sections, each programmable to provide a logic function based on configuration information, a different programmable logic section being coupled to each of the first, second, third and fourth conductive lines.

15. A method of enabling signal paths in a programmable logic device, comprising the steps of:
for each of a plurality of switching circuits, each formed at the intersection of a different set of at least four different signal paths, providing separate controllable input paths between each different signal path and an input of a logic circuit of the switching circuit, and providing separate controllable output paths between each different signal path and an output of the logic circuit;
in response to configuration information, enabling one of the input paths to the logic circuit while disabling all other input paths, and enabling at least the output path for the signal path corresponding to the enabled input path; and
providing the logic circuit by forming at least two logic junction field effect transistors (JFETs).

16. The method of claim 15, wherein:
enabling one of the input paths to the logic circuit includes applying a first potential to one junction field effect transistor (JFET) disposed in the one enabled input path, and
disabling all other input paths includes applying a second potential to other JFETs disposed in the disabled input paths.

17. The method of claim 15, wherein:
providing separate controllable input paths includes forming at least one input junction field effect transistor (JFET) corresponding to each input path, each input JFET including at least a gate electrode, a source electrode, and a drain electrode patterned from a common semiconductor layer formed on and in contact with a semiconductor substrate, the gate electrode being doped to an opposite conductivity type than the source and drain electrodes.

18. The method of claim 15, wherein:
each logic JFET includes at least a gate electrode, a source electrode, and a drain electrode formed from a common semiconductor layer formed on and in contact with a semiconductor substrate, the gate electrode being doped to an opposite conductivity type than the source and drain electrodes.

19. The method of claim 18, wherein:
each logic JFET further includes a drain substrate region formed in the substrate including between the gate electrode and drain electrode, and a source substrate region formed in the substrate including between the gate electrode and source electrode.

20. The method of claim 15, further wherein:
providing separate controllable input paths includes forming at least one output junction field effect transistor (JFET) corresponding to each output path, each output JFET including at least a gate electrode, a source electrode, and a drain electrode patterned from a common semiconductor layer formed on and in contact with a semiconductor substrate, the gate electrode being doped to an opposite conductivity type than the source and drain electrodes.

* * * * *